United States Patent
Regan et al.

(10) Patent No.: US 11,626,213 B2
(45) Date of Patent: Apr. 11, 2023

(54) SODIUM VAPORIZER AND METHODS

(71) Applicant: TerraPower, LLC, Bellevue, WA (US)

(72) Inventors: Christopher M. Regan, Seattle, WA (US); Jacob Wilcox, Seattle, WA (US)

(73) Assignee: TerraPower, LLC, Bellevue, WA (US)

( * ) Notice: Subject to any disclaimer, the term of this patent is extended or adjusted under 35 U.S.C. 154(b) by 57 days.

(21) Appl. No.: 16/934,901

(22) Filed: Jul. 21, 2020

(65) Prior Publication Data

US 2021/0057117 A1 Feb. 25, 2021

Related U.S. Application Data

(60) Provisional application No. 62/891,244, filed on Aug. 23, 2019.

(51) Int. Cl.
  *C23C 14/24* (2006.01)
  *G21C 17/028* (2006.01)
  (Continued)

(52) U.S. Cl.
  CPC ............ *G21C 17/028* (2013.01); *B01B 1/005* (2013.01); *B01J 8/0285* (2013.01); *B05C 11/11* (2013.01);
  (Continued)

(58) Field of Classification Search
  CPC .......... B01B 1/005; B01D 1/06; B01J 8/0285; B05C 11/11; C23C 14/14; C23C 14/243;
  (Continued)

(56) References Cited

U.S. PATENT DOCUMENTS 3,853,504 A 12/1974 Buscher
3,993,453 A 11/1976 Ross et al.
(Continued)

FOREIGN PATENT DOCUMENTS

EP 0508715 10/1992
GB 2005900 4/1979
(Continued)

OTHER PUBLICATIONS

PCT International Search Report and Written Opinion in International Application PCT/US2020/042905, dated Nov. 4, 2020, 17 pages.
(Continued)

*Primary Examiner* — Charles S Bushey
(74) *Attorney, Agent, or Firm* — Merchant & Gould P.C.

(57) ABSTRACT

A vaporizer includes an outer tube configured to receive a flow of heated gas and an inner tube disposed at least partially within the outer tube. The inner tube is spaced apart from the outer tube such that the flow of heated gas is channeled through an annular space therebetween. The vaporizer also includes a crucible disposed at least partially within the inner tube. The crucible is extendable and retractable relative to the inner tube and within the outer tube. The crucible is configured to hold a molten metal such that a surface area of the molten metal exposed to the flow of heated gas is adjustable based on the position of the crucible relative to the inner tube. A heater is configured to vaporize the molten material and the vapor mixes with the flow of heated gas.

16 Claims, 5 Drawing Sheets

(51) Int. Cl.
*C23C 14/14* (2006.01)
*B05C 11/11* (2006.01)
*B01B 1/00* (2006.01)
*F27B 14/10* (2006.01)
*B01J 8/02* (2006.01)
*B01D 1/06* (2006.01)
*G01N 27/626* (2021.01)

(52) U.S. Cl.
CPC ............ *C23C 14/14* (2013.01); *C23C 14/243* (2013.01); *F27B 14/10* (2013.01); *B01D 1/06* (2013.01); *G01N 27/626* (2013.01); *Y10S 261/65* (2013.01)

(58) Field of Classification Search
CPC ..... F27B 14/10; G01N 27/626; G21C 17/028; Y10S 261/65
USPC ......... 261/129, 130, 131, 135, 142, DIG. 65
See application file for complete search history.

(56) References Cited

U.S. PATENT DOCUMENTS

| | | | |
|---|---|---|---|
| 4,047,040 A | 9/1977 | Houston | |
| 4,047,101 A | 9/1977 | Bauerle | |
| 4,095,171 A | 6/1978 | Baurle | |
| 4,117,396 A | 9/1978 | Berkey | |
| 4,119,488 A | 10/1978 | Barosi | |
| 4,121,458 A | 10/1978 | Fort | |
| 4,131,511 A | 12/1978 | Mordarski | |
| 4,195,891 A * | 4/1980 | Hellier | C22B 26/10 252/512 |
| 4,257,847 A | 3/1981 | Gibby et al. | |
| 4,325,029 A | 4/1982 | Hrizo | |
| 4,366,438 A | 12/1982 | Ibe | |
| 4,578,242 A * | 3/1986 | Sharma | C22B 5/04 420/83 |
| 4,587,083 A | 5/1986 | Colburn | |
| 4,710,343 A | 12/1987 | Christiansen et al. | |
| 4,719,355 A | 1/1988 | Meyers | |
| 4,782,235 A | 11/1988 | Lejeune | |
| 4,845,364 A | 7/1989 | Alexander | |
| 4,853,177 A | 8/1989 | Pettus | |
| 4,984,952 A * | 1/1991 | Reuter | F27B 14/04 414/154 |
| 5,030,411 A | 7/1991 | Cooper | |
| 5,820,681 A | 10/1998 | Colombo | |
| 6,030,458 A * | 2/2000 | Colombo | C23C 14/243 118/719 |
| 6,117,208 A * | 9/2000 | Sharma | C22B 34/1268 75/613 |
| 6,316,773 B1 | 11/2001 | Giakos | |
| 6,602,919 B1 | 8/2003 | Collins | |
| 6,840,085 B1 | 1/2005 | Kolaja | |
| 7,794,630 B2 * | 9/2010 | Cattaneo | C23C 14/24 252/518.1 |
| 7,842,194 B2 * | 11/2010 | Giannantonio | H01J 9/12 252/181.4 |
| 8,123,862 B2 * | 2/2012 | Ohara | C23C 14/26 118/727 |
| 8,308,866 B2 * | 11/2012 | Negishi | C23C 14/56 118/719 |
| 8,421,470 B2 | 4/2013 | Kitano | |
| 8,502,158 B1 | 8/2013 | Gordeev | |
| 9,178,103 B2 | 11/2015 | Wu et al. | |
| 9,341,596 B1 | 5/2016 | Chen | |
| 9,921,184 B2 | 3/2018 | Corbin | |
| 10,636,532 B2 | 4/2020 | Anderson | |
| 10,685,750 B2 | 6/2020 | Eichel | |
| 2003/0127053 A1 | 7/2003 | Kim | |
| 2003/0201586 A1 | 10/2003 | Kim | |
| 2009/0277390 A1 | 11/2009 | Soininen | |
| 2013/0010915 A1 | 1/2013 | Garnier | |
| 2014/0007814 A1 * | 1/2014 | Villette | C23C 14/26 118/727 |
| 2016/0208374 A1 * | 7/2016 | Lattimer | C23C 14/26 |
| 2016/0320334 A1 | 11/2016 | Nakatou | |
| 2017/0337995 A1 | 11/2017 | Anderson et al. | |
| 2020/0105428 A1 | 4/2020 | Corbin | |
| 2020/0258644 A1 | 8/2020 | Anderson | |

FOREIGN PATENT DOCUMENTS

| | | |
|---|---|---|
| GB | 2031216 | 4/1980 |
| GB | 2183893 | 6/1987 |
| JP | 5015204 | 6/1975 |
| JP | 51107212 A | 9/1976 |
| JP | 51140875 A | 12/1976 |
| JP | S5551396 | 4/1980 |
| JP | S6043447 | 3/1985 |
| JP | S61228382 | 10/1986 |
| JP | 01123198 A | 5/1989 |
| JP | 02183199 A | 7/1990 |
| JP | H0469592 | 3/1992 |
| JP | 04122897 A | 4/1992 |
| JP | 1992122897 | 4/1992 |
| JP | 04286996 A | 10/1992 |
| JP | 1992286996 | 10/1992 |
| JP | 05100065 A | 4/1993 |
| RU | 2328783 | 7/2008 |
| SU | 693868 | 8/1984 |

OTHER PUBLICATIONS

Bechtold, R.A., et al., FFTF Cesium Trap Design, Installation, and Operating Experience, Fourth International Conference on Liquid Metal Technology, Avignon, France, Oct. 18, 1988. Date Published Jun. 1988, 12 pages.
Cesium Getter Development—Poster, TerraPower, LLC, Mar. 2021.
International Atomic Energy Agency Radioactive Sodium Waste Treatment and Conditioning, IAEA, Vienna, 2007, IAEA-TECDOC-1524, ISBN 92-0-116006-2, ISSN 1011-4289, 68 pages.
Romanenko, O.G., et al., Cleaning Cesium Radionuclides from BN-350 Primary Sodium, Nuclear Technology, Published online: Apr. 10, 2017, 22 pages.
Wahlquist, D.R., et al., Equipment Design Guidelines for Remote Hot Cell Operations, Argonne National Laboratory-West, American Glovebox Society 11th Annual Conference Orlando, Florida Jul. 12-15, 1998, 11 pages.
Barton, G.B., "Prototype Applications Loop (PAL) and Sodium Characterization System (SCS) Investigations—Vapor Trap Performance, Cover Gas Analysis and Interpretation of Analyses", Hanford Engineering Development Laboratory, Nov. 1973, 39 pages.
Breitwieser et al., Saha-Langmuir Surface Ionization Relation, Thermionic Conversion Specialist Conference sponsored by the Institute of Electrical and Electronics Engineers, San Diego, CA Oct. 25-27, 1965, 13 pages.
Chandran et al., "Performance testing of in-sodium sensors and simulated experiments in, sodium chemistry loop", Nuclear Engineering and Design 268 (2014) 1-9.
Dunn et al., Calculation of Electrical and Thermal Conductivities of Metallurgical Plasmas, Bulletin (Welding Research council (U.S.)), 357, 21 pages, 1990.
Hrizo et al., Sodium Ionization Detector and Sensor, Final Technical Report, Westinghouse Research and Development Center, Contract EN-77-C-02-4197.A000 Department of Energy, May 8, 1979, 51 pages.
Langmuir et al., Thermionic Effects Caused by Vapours of Alkali Metals, Proc. of the Royal Society a Mathematical Physical & Engineering Sciences, 107, doi: 10.1098/rspa.1025.0005, published Jan. 1, 1925, 20 pages.
Lau, J., Electrical Conductivity of Inert Gases—Seed Combination in Shock Tubes, Defense Documentation Center for Scientific and Technical Information, DDC No. 445232, Aug. 1964, 21 pages.
Morris et al., An Evaluation of Liquid Metal Leak Detection Methods for the Clinch River Breeder Reactor Plant, Prepared for the US Nuclear Regulatory Commission under Related Services Contract 8D08 to the Prime Contract CY-76-C-06-1830 with the Department of Energy, Dec. 1977, 121 pages.

(56) References Cited

OTHER PUBLICATIONS

Mozgovoy et al., New Equations of State and the Tables of Cesium Vapor Thermodynamic Properties at Temperatures <1700K and Pressure <5.5 Mpa, Chemistry and Computational Simulation. Butlerov Communications. vol. 3. No. 10, pp. 36-38, 2001.
PCT International Preliminary Report on Patentability for PCT/U2017/033578, dated May 19, 2017, 7 pages.
PCT International Preliminary Report on Patentability in International Application PCT/US2017/021125, dated Sep. 20, 2018, 9 pages.
PCT International Preliminary Report on Patentability in International Application PCT/US2018/025216, dated Oct. 10, 2019, 8 pages.
PCT International Search Report and Written Opinion for PCT/US17/33578, dated Mar. 6, 2018, 16 pages.
PCT International Search Report and Written Opinion in International Application PCT/US2017/021125, dated Nov. 21, 2017, 12 pages.
PCT International Search Report and Written Opinion in International Application PCT/US2018/025216, dated Sep. 18, 2018, 11 pages.
RDT Standard, Vapor Trap Assemblies for Sodium Service, Apr. 1972, 66 pages.
Romanenko et al., Immobilization of Cesium Traps from the BN-350 Fast Reactor, WM2011 Conference, Feb. 27-Mar. 3, 2011, Phoenix, AZ., pp. 1-15.
Sobolev, A. et al., "Purification of the Coolant of Fast Reactors from Cesium", Atomic Energy, 72(3): 220-224 (1992).
Sodium Cesium Ion Detector—Lab Poster, shown at Open House, Nov. 20, 2015, 1 page.
Sodium Vapor Trap Lab Poster, TerraPower LLC, Nov. 2015, 1 page.
Studart et al., "Processing Routes to Macroporous Ceramics: A Review", Journal of the American Ceramic Society, vol. 89, Issue 6, Jun. 2006, 1771-1789.
Swaminathan, K., Development of a Sodium Ionisation Detector for Sodium-to-gas Leaks, Reactor Research Centre, Kalpakkam 603 102 Tamil Nadu, India, 1979, 21 pages.
Sylvia et al., Development of sodium leak detectors for PFBR, Nuclear Engineering and Design 249 (2012) 419-431.
Vaidyanathan et al., Sensors in Sodium Cooled Fast Breeder Reactors, National Journal of Electronic Sciences & Systems, vol. 3 No. 2, Oct. 2012, 10 pages.
Wolson et al., Development of on-line Monitoring Device to Detect the Presence/Absence of Sodium Vapor, ANL—83-21, Mar. 1983, 18 pages.
Yamamoto et al., Development of Fluctuation Monitor Type Sodium Ionization Detector, Journal of Nuclear Science and Technology, 23:7, 573-581, 1986.
Yamamoto et al., Using Anemometer for Particle Size Measurement of Sodium Mist, Journal of Nuclear Science and Technology, 16:8, 616-618, 1979.

\* cited by examiner

SODIUM VAPORIZER AND METHODS

CROSS-REFERENCE TO RELATED APPLICATIONS

This application claims priority to and the benefit of U.S. Provisional Application No. 62/891,244, filed Aug. 23, 2019, which is hereby incorporated by reference herein in its entirety.

INTRODUCTION

Sodium-cooled nuclear reactors may use sodium ionization detectors to diagnose system performance in removing alkali metal vapors and/or detecting leaks in safety systems. The sodium ionization detectors produce an electrical signal proportional to a concentration of sodium vapor in an inert gas. As such, quantitative measurement of sodium vapor concentrations requires calibration of sodium ionization detectors so that the relation between the signal and the concentration is known.

In order to calibrate the sodium ionization detectors, heated inert gas is passed through a sodium containing vaporizer. The sodium is heated, and the resulting vapor is carried in the inert gas through a detector which produces ion current between a filament and a collector. Then the vapor is trapped downstream of the detector and its contents are elementally analyzed to determine a total amount of sodium trapped over the calibration run. The vaporizer must produce a steady vapor output so that the time averaged vapor concentration in the inert gas is known with low variance, and the corresponding average detector signal can be measured. To get a series of data points for a calibration curve, the vaporizer temperature is incremented to produce more or less signal (e.g., ion current), and a new run is performed.

It is desirable that the vapor source produce a stable vapor output over the calibration run and over a range of sodium vapor concentration levels. This is because a particular concentration in the gas, which corresponds to a mass of sodium collected and averaged over the duration of the calibration run, will be correlated to a single average signal value at the sodium ionization detector. It can be difficult, however, to generate a stable vapor flow for both high and low sodium vapor concentration levels. Sodium can form an oxide film/layer over its molten surface that inhibits vaporization of the sodium into the inert gas. While increasing the temperature of the sodium slowly dissolves the sodium oxide (e.g., over many hours), during the dissolving process an unstable vapor output is generated. However, significantly increasing the temperature of the molten sodium (e.g., 250°–350° C.) can rapidly dissolve the oxide layer and yield a stable vapor output. But, this stability is only generated for a high sodium vapor concentration flow and low sodium vapor concentration flows remain unstable. This is because a high vapor output concentration is always produced with the high temperatures, and this output is difficult to dilute using a higher flow rate of inert gas since the detector must be calibrated at a set (e.g., constant) flow rate for certain diagnostic operations. Accordingly, improved vaporizers are desired.

Sodium Vaporizer and Methods

Vaporizers and vaporization methods are described herein for holding a charge of molten material at sufficiently high temperatures to rapidly dissolve oxides and produce a stable vaporization output. This vapor output can be mixed with a flow of heated inert gas for use in calibration of ionization detectors. The molten material is held in a movable crucible within a guide tube that allows for a surface area of the molten material exposed to the inert gas to be adjustable and vary the concentration of the vapor within the inert gas. As such, a stable vaporization output is generated for a wide range of vapor concentrations (e.g., both higher and lower concentration levels).

These and various other features as well as advantages which characterize the vaporizers and methods described herein will be apparent from a reading of the following detailed description and a review of the associated drawings. Additional features are set forth in the description which follows, and in part will be apparent from the description, or may be learned by practice of the technology. The benefits and features of the technology will be realized and attained by the structure in the written description and claims hereof, as well as the appended drawings.

It is to be understood that both the foregoing introduction and the following detailed description are exemplary and explanatory and are intended to provide further explanation of the invention as claimed.

BRIEF DESCRIPTION OF THE DRAWINGS

The following drawing figures, which form a part of this application, are illustrative of described technology and are not meant to limit the scope of the technology as claimed in any manner, which scope shall be based on the claims appended hereto.

DETAILED DESCRIPTION

This disclosure describes a vaporizer and methods for creating a variable concentration stream of vaporized material. The vaporizer includes a crucible that holds a charge of molten material. The crucible is slidably disposed at least partially within an inner chamber/guide tube and is configured to selectively extend and retract therefrom. An outer chamber surrounds both the crucible and the inner chamber, and receives a flow of heated inert gas. The inert gas passes over the exposed surface area of molten material and mixes with the vapor. The mixture of inert gas and vaporized material can be used for calibration of ionization detectors (e.g., sodium ionization detectors in sodium fast reactor plants), physical vapor deposition processes, or any other process/method as required or desired.

When the molten material is retracted into the inner chamber, the inner chamber shields the molten material from the inert gas flowing within the outer chamber. As such, the surface area of the molten material within the outer chamber can be selectively adjusted so as to control the vapor output into the inert gas, and thus, the concentration thereof. By being able to control the vapor output of the molten material into the inert gas, the vaporizer can heat the molten material to temperatures that are suitable for producing a stable vaporization output over a range of concentrations between a high (e.g., greater amounts of molten material surface area) and a low (e.g., smaller amounts of molten material surface area) vapor concentration level.

Figure 1:
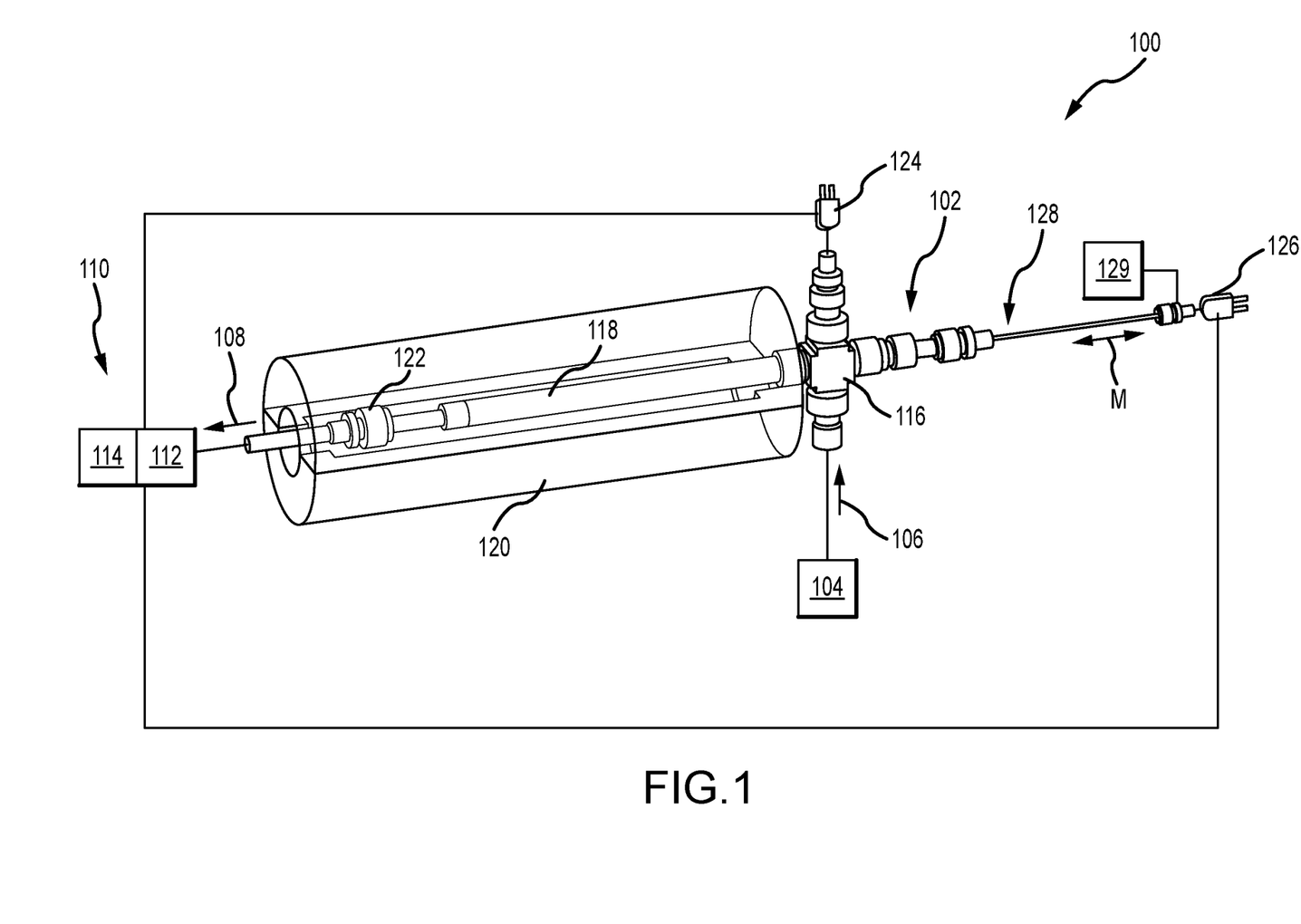
FIG. 1 is a schematic view of an exemplary vaporizer system.

FIG. 1 is a schematic view of an exemplary vaporizer system 100. The vaporizer system 100 includes a vaporizer 102 that is configured to hold a charge of molten material for vaporization and allow heated inert gas to pass over the charge to mix with the vapor. A gas supplier 104 is coupled in flow communication to the vaporizer 102. The gas supplier 104 generates a heated flow 106 of inert gas, such as, but not limited to, argon or nitrogen, for collecting at least a portion of the vapor generated within the vaporizer 102. After the vapor mixes with the heated inert gas, the mixture 108 is carried downstream from the vaporizer 102 into a calibration system 110. The calibration system 110 includes a detector 112 that is configured to produce an ion current between an anode and a cathode and record the current signal. Additionally, the calibration system 110 includes a gas scrubber/trap 114 that is configured to collect and analyze the vapor within the mixture 108. The calibration system 110 can then generate a calibration curve based on the measured data points and over a plurality of calibration runs (e.g., a steady flow with differing vapor concentration levels in the mixture 108).

The vaporizer 102 includes a gas manifold 116 that couples to the gas supplier 104 and receives the heated flow of inert gas 106. The gas manifold 116 is coupled to an outer chamber 118 that receives the heated inert gas and also holds the charge of molten material therein. A clamshell heater 120 at least partially encloses the outer chamber 118 and enables the molten material to be heated as required or desired. The heater 120 is illustrated as transparent in FIG. 1 so as to be able to view the components within. Downstream of the outer chamber 118 is a sintered metal filter 122 that is configured to remove entrained droplets or aerosols in the vapor mixture 108 before entering the calibration system 110. The filter 122 can be disposed at least partially within the heater 120. A gas thermocouple 124 is coupled to the gas manifold 116 so as to measure the temperature of the flow of heated inert gas 106. The thermocouple 124 can be coupled in communication with the calibration system 110 so as to provide temperature data of the heated gas for the calibration process. Additionally, a molten material thermocouple 126 is coupled to the charge of molten material so as to measure the temperature of the molten material. The thermocouple 126 can be coupled in communication with the calibration system 110 so as to provide temperature data of the molten material for the calibration process. For example, the thermocouples 124, 126 are used so that the temperature of the gas can be substantially matched to the temperature of the molten material and aerosol formation is reduced or prevented.

In the example, the heater 120 is a clamshell heater that surrounds the outer chamber 118 and the filter 122 but does not surround the gas manifold 116. This configuration allows the heater 120 to heat the molten material to the required or desired temperature and keep the filter 122 at a similar temperature to reduce or prevent generation of aerosols that are detrimental to the calibration of the detector, and to produce a steady vapor output. In other examples, the heater 120 can include any other heater that enables the vaporizer 102 to function as described herein. For example, the heater 120 may extend so as to partially surround other components, such as, the gas manifold 116. This configuration can allow the heater 120 to maintain uniform molten material and other vaporizer component temperatures to reduce or prevent generation of aerosols and reduce the need for the filter 122.

Additionally or alternatively, the heater 120 may comprise a plurality of heaters so that the vaporizer 102 can have one or more heating zones. In an aspect, the heater 120 can have a first heater (e.g., the clamshell heater) that surrounds the outer chamber 118 and a second heater (not shown) that is configured to heat the gas manifold 116. In this example, the second heater can heat the molten material that is disposed within the gas manifold 116 to a temperature that is about equal to that of the first heater 120. In other examples, the second heater can heat the molten material to a temperature that is above, or lower than, that of the first heater 120. By at least partially heating the gas manifold 116, the molten material that is disposed therein will be prevented from cooling. This allows for the mechanical adjustment of the vaporizer 102 to adjust vapor output. In other examples, by heating the molten material in different heating zones, vapor output can be adjusted thermally, in addition to, or alternatively from, the mechanical adjustment.

The vaporizer 102 also includes a movement mechanism 128 that is configured to control the position of the charge of molten material within the outer chamber 118. The movement mechanism 128 is coupled to an actuator 129 that is configured to generate linear movement M. The actuator 129 can include any type of system or device that generates linear movement as described herein. For example, an electronic motor, a solenoid, manual movement, etc. The movement mechanism 128 enables for the surface area of the molten material to be selectively controlled and induce a steady flow of the mixture 108 with differing vapor concentration levels as described herein.

Figure 2:
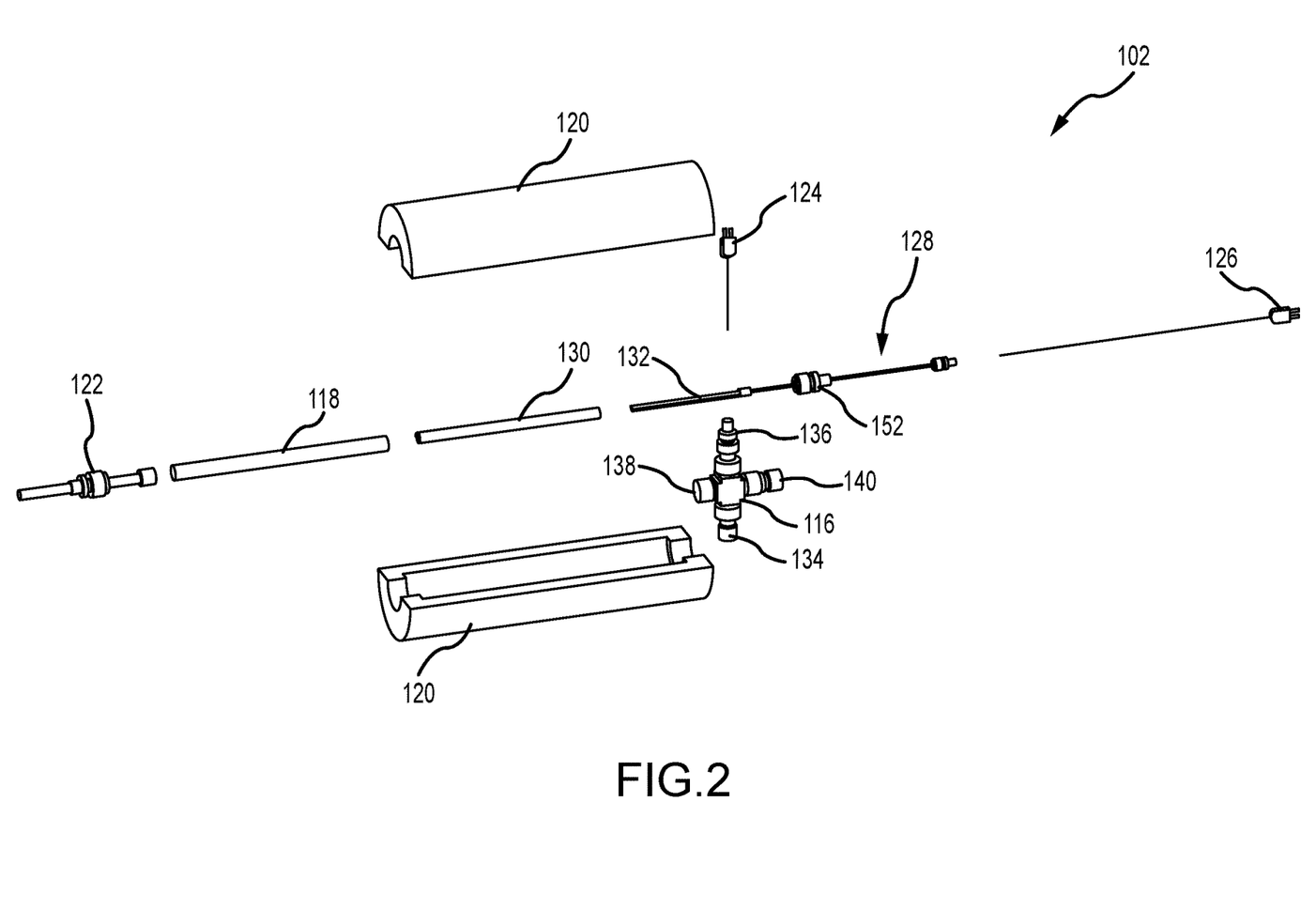
FIG. 2 is an exploded perspective view of an exemplary vaporizer of the system shown in FIG. 1.

FIG. 2 is an exploded perspective view of the vaporizer 102 of the vaporizer system 100 (shown in FIG. 1). As described above in reference to FIG. 1, the vaporizer 102 includes the gas manifold 116, the outer chamber 118, the heater 120, the filter 122, the thermocouples 124, 126, and the movement mechanism 128. Additionally, the vaporizer 102 includes an inner chamber 130 that is disposed at least partially within the outer chamber 118 and spaced apart therefrom. In the example, both the outer chamber 118 and the inner chamber 130 are substantially tube-shaped components, and thus, the outer tube 118 has a diameter that is greater than a diameter of the inner tube 130 and both tubes are substantially concentric with one another.

An elongate boat 132 is disposed at least partially within the inner chamber 130 and is configured to hold the charge of molten material and allow the heated inert gas to pass above the surface of the molten material. In the example, the boat 132 is an open container, and in some examples, can be a crucible as required or desired. In the example, the heater 120 at least partially surrounds the boat 132 so as to induce vaporization of the molten material. The boat 132 is coupled to the movement mechanism 128 so that the boat 132 can extend and retract relative to the inner chamber 130 while still being housed within the outer chamber 118. The inner chamber 130 acts as a guide tube and cover for the boat 132 in the vaporizer 102.

In the example, the gas manifold 116 can be a four-way connector such as a union cross fitting. One opening can include a reducer fitting 134 so that the manifold 116 can be coupled in flow communication with the gas supplier 104 (shown in FIG. 1). The opposite opening can also include a reducer fitting 136 that is configured to support the gas thermocouple 124 and enable the thermocouple 124 to measure the temperature of the heated inert gas that flows though the manifold 116. One end of the outer chamber 118 can be coupled to another opening 138 so that the flow of heated gas can be channeled into the outer chamber 118. The opposite opening can include a fitting 140 that is used to support the inner chamber 130 that extends through the manifold 116. For example, the fitting 140 can be a bore-through fitting that allows the inner chamber 130 to slide through. Additionally, the movement mechanism 128 includes a reducing union fitting 152 that connects to a nut on the back end of the inner chamber 130 and swages to the movement mechanism 128. The fitting 152 can be used to allow the boat 132 to be completely removed from within the inner chamber 130. It should be appreciated that other orientations and layouts of the components of the manifold 116 can be used as required or desired.

Figure 3:
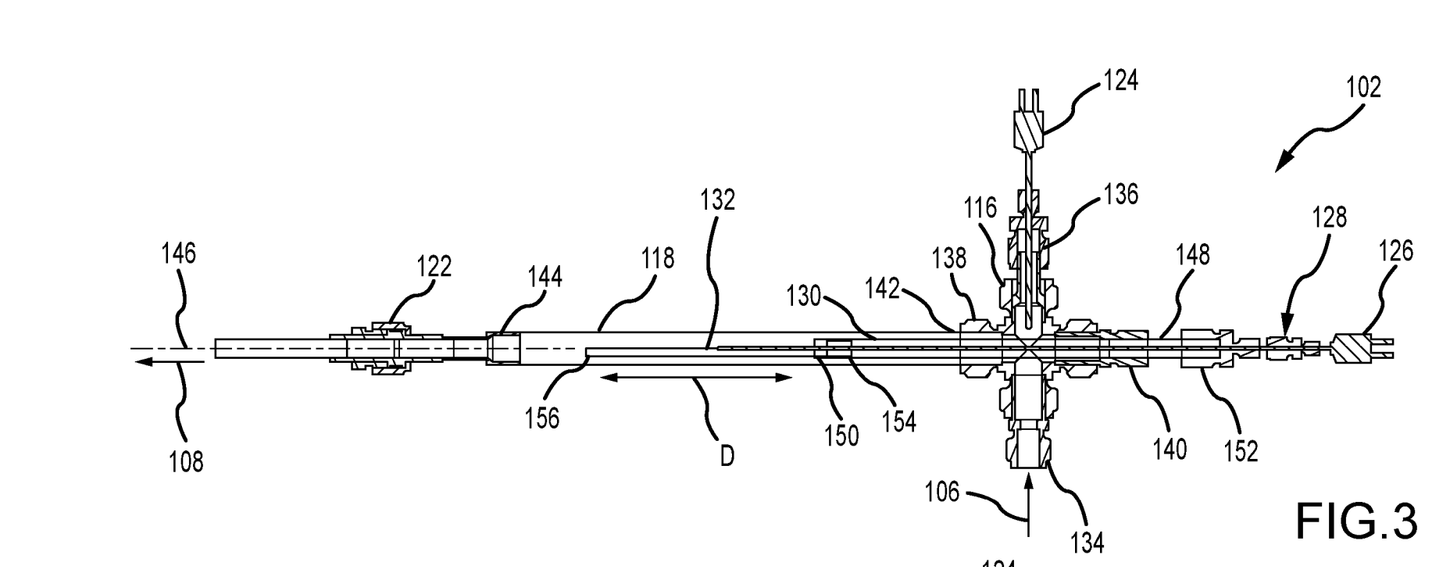
FIG. 3 is a cross-sectional view of the vaporizer in an extended position.

FIG. 3 is a cross-sectional view of the vaporizer 102 in an extended position. Certain components are described above, and thus, are not necessarily described further. Additionally, the heater 120 (shown in FIGS. 1 and 2) is not illustrated for clarity. The outer chamber 118 has an inlet 142 and an opposite outlet 144 with a longitudinal axis 146 defined therebetween. The inlet 142 is coupled to the opening 138 of the gas manifold 116 so that the heated inert gas can flow therethrough.

The inner chamber 130 has a first end 148 and an opposite second end 150, and extends along the longitudinal axis 146. The first end 148 of the inner chamber 130 is supported at one or more locations proximate the fitting 140 that is opposite of the opening 138 of the gas manifold 116 and which receives the outer chamber 118. As such, the inner chamber 130 cantilevers through the gas manifold 116 via the fitting 140 and extends partially into the outer chamber 118 to generate the cantilevered second end 150. Additionally in the example, the reducer fitting 152 is positioned adjacent to the fitting 140 and at the first end 148 of the inner chamber 130. The second end 150 of the inner chamber 130 is disposed within the outer chamber 118 and closer to the inlet 142. The reducer fitting 152 forms a seal to the interior of the vaporizer 100 and allows the movement mechanism 128 to extend within the inner chamber 130 and couple to the elongated boat 132. For example, the reducer fitting 152 includes a Teflon ferrule that allows the movement mechanism 128 to slide relative thereto. The fitting 140 also forms a seal around the inner chamber 130 at the gas manifold 116 so that the inner chamber 130 can extend out therefrom.

The elongate boat 132 is slidably disposed within the inner chamber 130 and proximate the second end 150. The boat 132 has a proximal end 154 that couples to the movement mechanism 128 and an opposite distal end 156 that is configured to extend and retract relative to the second end 150 of the inner chamber 130 and along the longitudinal axis 146. As illustrated in FIG. 3, the boat 132 is in its fully extended position. In the extended position, the boat 132 is still disposed completely within the outer chamber 118 and the distal end 156 extends a distance D from the second end 150 of the inner chamber 130. While a fully extended position of the distal end 156 is illustrated in FIG. 3, it should be appreciated that the distal end 156 can extend to any position that is less than the fully extended position via the movement mechanism 128 as required or desired.

In operation, the flow of heated inert gas 106 is channeled into the outer chamber 118 from the gas manifold 116 and towards the outlet 144. More specifically, the inert gas 106 is channeled into the annular space between the inner chamber 130 and the outer chamber 118 at the inlet 142 of the outer chamber 118. The inert gas 106 can then travel through this annular space until the second end 150 of the inner chamber 130, when the gas can pass over the boat 132 and the molten material disposed therein. The flow of inert gas mixes with the vapor emitted from the molten material to generate the mixture 108 that is expelled from the outlet 144 of the outer chamber 118 and used for calibration measurements.

In the example, the distance D that the boat 132 extends from the inner chamber 130 defines the surface area of the molten material that produces vapor which mixes with the inert gas as it passes over. As such, the surface area of the molten material is easily adjustable within the vaporizer 102 so that the vapor concentration within the emitted mixture 108 is easily controllable. Furthermore, this movement of the boat 132 allows for the heater to maintain a temperature of the molten material that produces stable vaporization (e.g., reducing oxide layers from forming on the material), while still enabling the vapor concentration in the mixture 108 to be controllable as required or desired.

Figure 4:
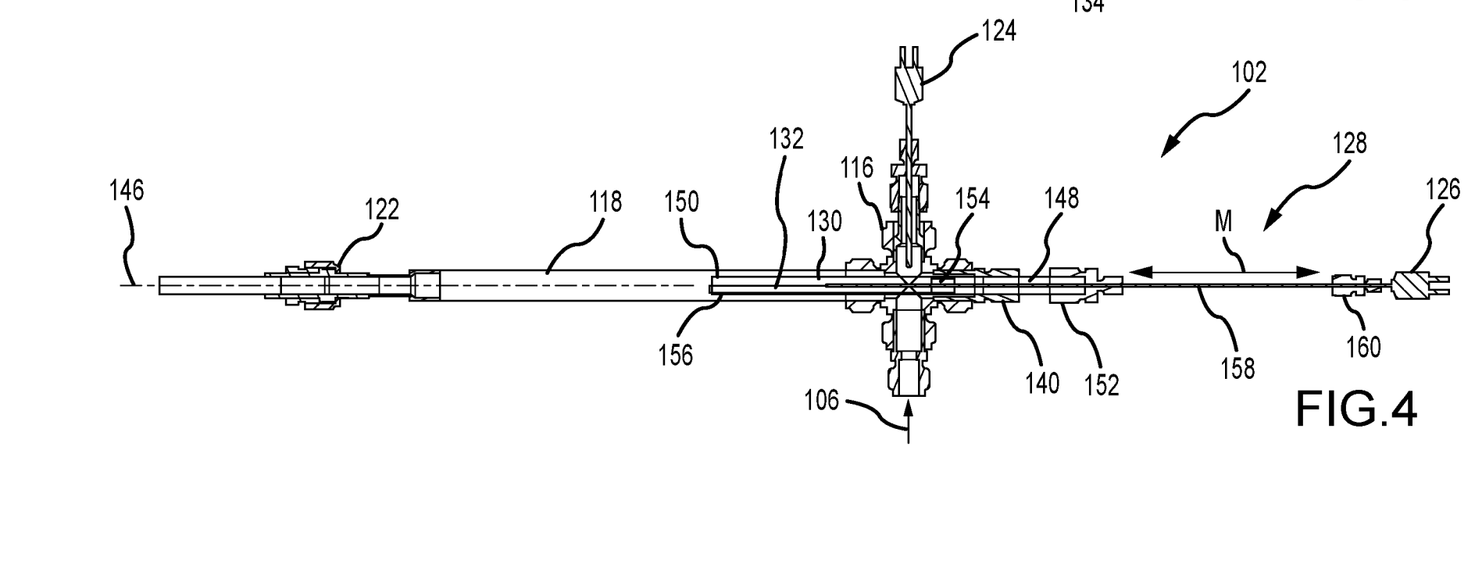
FIG. 4 is a cross-sectional view of the vaporizer in a retracted position.

FIG. 4 is a cross-sectional view of the vaporizer 102 in a retracted position. Certain components are described above, and thus, are not necessarily described further. Additionally, the heater 120 (shown in FIGS. 1 and 2) is not illustrated for clarity. In the fully retracted position, the flow of heated inert gas 106 can still be channeled through the vaporizer 102 as described above, however, the boat 132 is retracted so that the distal end 156 is positioned adjacent to the second end 150 of the inner chamber 130 and the molten material is fully disposed within the inner chamber 130. This position of the boat 132 shields the molten material from the heated inert gas 106 so that the inert gas no longer directly passes over the molten material and the vapor is reduced or prevented from mixing with the gas.

It should be appreciated that while a fully extended (FIG. 3) and a fully retracted (FIG. 4) position of the boat 132 is illustrated and described. The boat 132 can be positioned in any intermediate position as required or desired. The intermediate positions allow for the surface area of the molten material directly in contact with the flow of heated inert gas 106 to be adjusted and control of the vapor output that mixes with the inert gas because the gas does not directly pass over the molten material that is retracted within the inner chamber 130.

The movement mechanism 128 can be used to position the boat 132 relative to the inner chamber 130. The movement mechanism 128 can include a linkage 158 that extends through the first end 148 of the inner chamber 130 via the reducer fitting 152. One end of the linkage 158 couples to the proximal end 154 of the boat 132 so as to drive movement of the boat 132 to a desired or required distance D (shown in FIG. 3). The other end of the linkage 158 is coupled to a coupler 160 so that linkage 158 can be attached to the actuator 129 (shown in FIG. 1) that drives linear movement M along the longitudinal axis 146. As such, the position of the movement mechanism 128 determines the position of the boat 132. The coupler 160 also allows for attachment of the molten material thermocouple 126. In the example, the linkage 158 is an elongated tube concentric with both the chambers 118, 130 so that the junction of the thermocouple 126 can extend to the boat 132.

Figure 5:
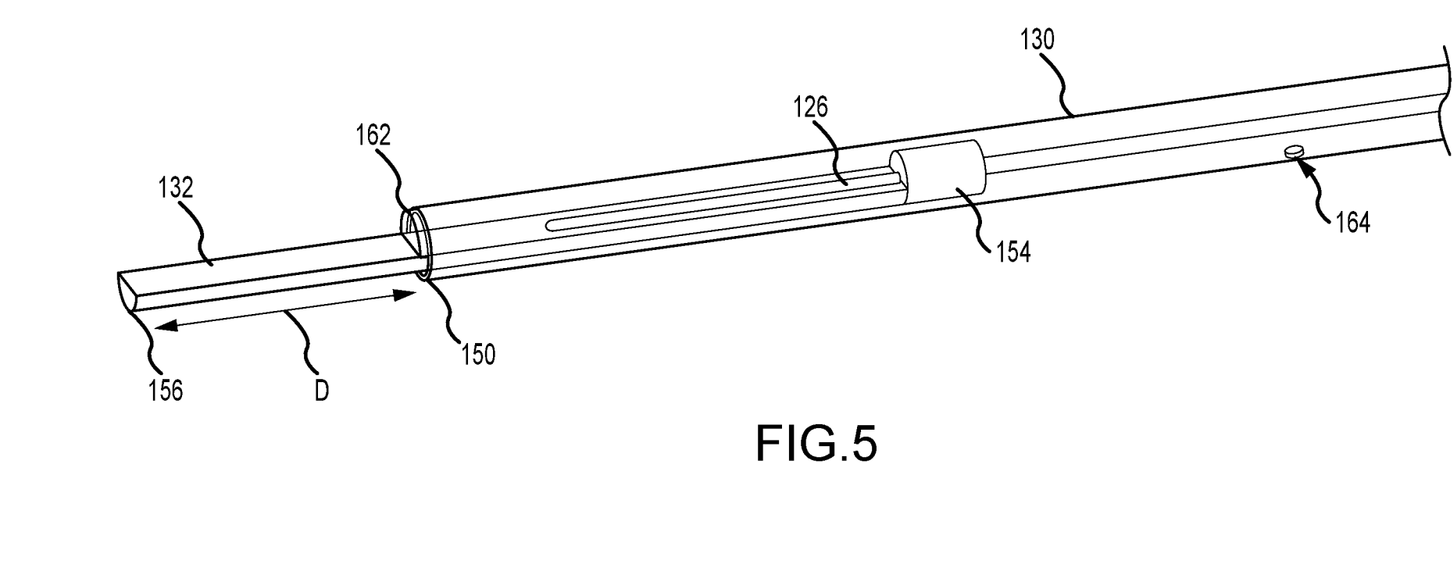
FIG. 5 is a perspective view of an exemplary elongate boat of the vaporizer shown in FIGS. 1-4.

FIG. 5 is a perspective view of the elongate boat 132 of the vaporizer 102 (shown in FIGS. 1-4). The inner chamber 130 is illustrated as transparent in FIG. 5 to show the boat 132 partially disposed therein. As illustrated in FIG. 5, the boat 132 is in a partially extended (or partially retracted) position, where the distal end 156 of the boat 132 is at a distance D from the second end 150 of the inner chamber 130. As such, a portion of the molten material disposed within the boat 132 is shielded within the inner chamber 130.

In the example, the boat 132 is substantially semicircular in cross-sectional shape so that it can hold the molten material within the vaporizer and form a surface area that is exposed to the heated inert gas. The second end 150 of the inner chamber 130 is partially enclosed with an endcap 162 so as to further shield the molten material that is within the inner chamber 130 from the flow of heated inert gas. While the structure of the inner chamber 130 and the boat 132 restricts vapor from within the inner chamber 130 from mixing with the inert gas outside of the inner chamber 130, the endcap 162 does not fully seal the second end 150 of the inner chamber 130 and at least a portion of the inert gas and/or the vapor can pass through the second end 150. In the example, the endcap 162 can be a semicircle shape, and as such, the endcap 162 can also be used to prevent the boat 132 from rotating about the longitudinal axis (e.g., the sidewalls of the boat 132 engaging with the endcap 162) during operation. Additionally, the junction of the thermocouple 126 extends through the proximate end 154 of the boat 132 so as to be able to measure the molten material contained within. The thermocouple 126 is disposed at the bottom of the boat 132 and during operation can covered by the molten material. As such, a sheathed thermocouple 126 can be used so that the thermocouple wires and junction are protected from the liquid metal.

Additionally, the inner chamber 130 has at least one aperture 164 defined therein. The aperture 164 is defined between the ends of the inner chamber 130. In an example, the aperture 164 is located on the inner chamber 130 so that the aperture 164 is positioned proximate the fitting 140 on the gas manifold 116 (shown in FIG. 2) when the vaporizer is assembled. This position enables for a portion of the heated inert gas to flow through the inner chamber 130 and expelled from the second end 150. The gas flow through the inner chamber 130 is less than the gas flow through the outer chamber, and is used to reduce or prevent the vapor from the molten material condensing at the first end 148 of the inner chamber 130 (shown in FIG. 3). As the first end of the inner chamber 130 may not be disposed within the heater 120 (shown in FIG. 1). In some examples, when the boat 132 is in its fully retracted position (shown in FIG. 4), at least a portion of the boat 132 may cover the aperture 164 so as to reduce the flow of heated inert gas through the inner chamber 130.

In the example, because the boat 132 retracts towards the gas manifold and at least partially out of the heater, the temperature of the molten material may decrease when the boat 132 is in a retracted position. This temperature change of the molten material may increase aerosol formation, however, the calibration curve can still be determined and any aerosols that are produced can be removed at the filter. In other examples, the heater may be configured to maintain the temperature of molten material at any position of the boat 132 (e.g., when the heater also surrounds at least a portion of the gas manifold) such that the vapor output is controlled at a constant temperature and aerosol formation is reduced or prevented.

During operation of the vaporizer, the position of the boat 132 relative to the inner chamber 130 defines the surface area of the molten material exposed to the flow of heated inert gas, and thus, the vapor output of the vaporizer. As such, reducing the surface area of the molten material lowers the vapor output of the vaporizer, while increasing the surface area of the molten material raises the vapor output of the vaporizer. In the examples described herein, it is the boat 132 that moves relative to the inner chamber 130. In other examples, the boat 132 can remain stationary while the inner chamber 130 can move relative to the boat 132 and adjust the surface area of the molten material exposed to the flow of heated inert gas.

The vaporizer described herein can be used to vaporize any type molten material as required or desired. In an aspect, the molten material may be an alkali metal, such as sodium. In other examples, other alkali metals, such as cesium, or a mixture of sodium and cesium that can be placed into the vaporizer. In another aspect, potassium or rubidium may be vaporized.

Figure 6:
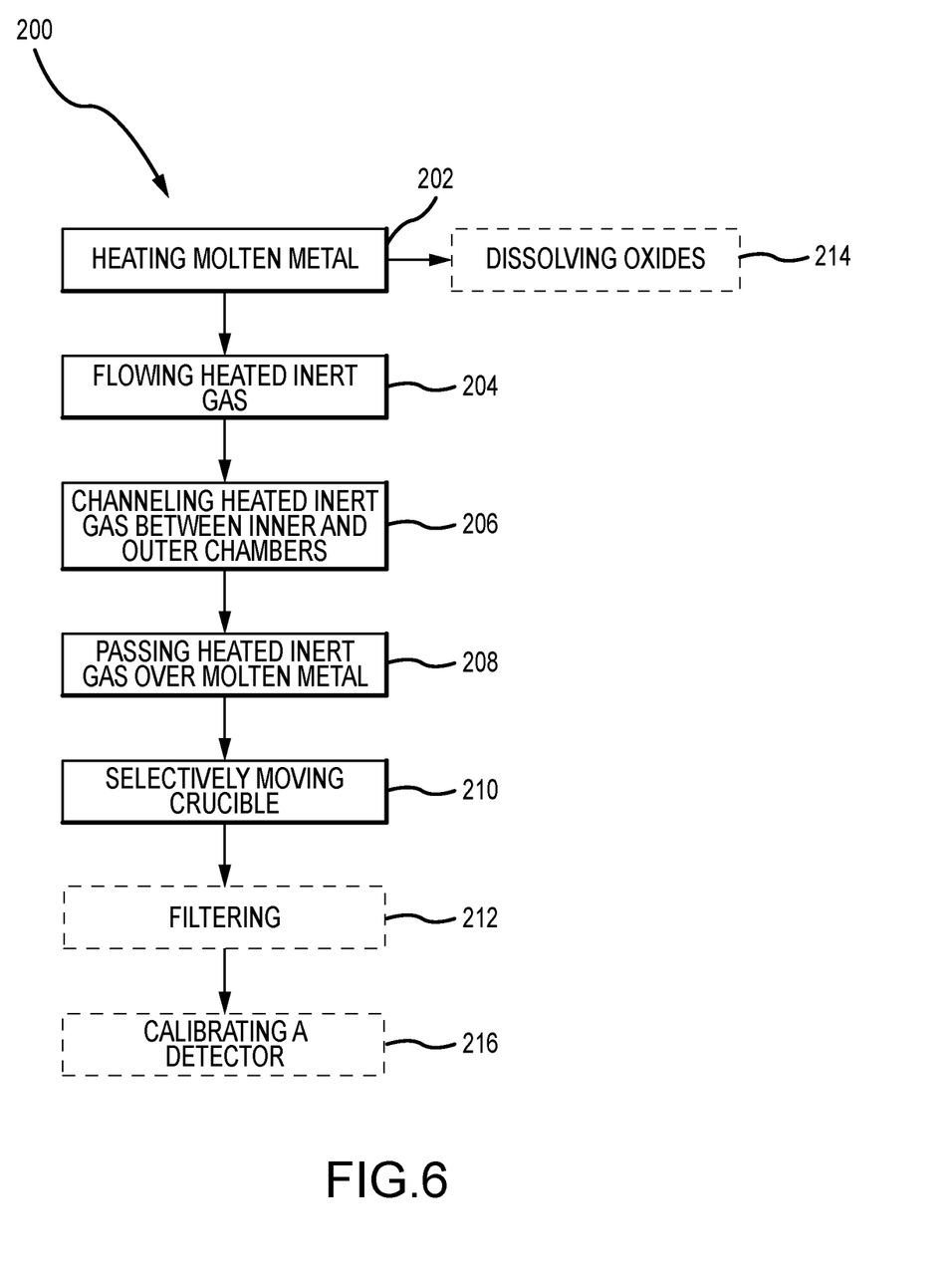
FIG. 6 is a flowchart illustrating an exemplary method for vaporizing a molten metal.

FIG. 6 is a flowchart illustrating an exemplary method 200 for vaporizing a molten metal. The method 200 begins with a charge of molten metal held within a crucible being heated to generate a vapor output (operation 202). The crucible being disposed at least partially within an inner chamber. Additionally, heated inert gas is flowed into an inlet of an outer chamber (operation 204). The inlet chamber being at least partially disposed within the outer chamber. The flow of heated inert gas is then channeled between the inner chamber and the outer chamber (operation 206). Downstream of the inner chamber, the flow of heated inert gas is passed over a surface area of the molten metal contained within the crucible (operation 208). Upon the heated inert gas passing over the surface area of the molten metal, at least a portion of the vapor output mixes with the heated inert gas and is carried further downstream. The crucible can be selectively moved relative to the inner chamber (operation 210) so as to adjust the surface area of the molten metal exposed to the flow of heated inert gas and change the vapor output of the molten metal.

In some examples, the method 200 may further include filtering the mixture of vapor output and heated inert gas (operation 212) to remove entrained droplets or aerosols. The heating operation (operation 202) may further include heating the molten metal such that oxides within the molten metal are dissolved (operation 214). Also, the molten metal and the inert gas can be heated to approximately an equal temperature so as to reduce aerosol formation. In an aspect, the molten metal in the method 200 may be sodium. The method 200 can further include calibrating a sodium ionization detector via the vapor output (operation 216).

In an aspect, prior to vaporizing the molten metal, the crucible may be actively wetted. Otherwise the molten metal may have a tendency to bead up and stay off of non-wetted sections such that the molten metal does not spread evenly within the crucible. To wet the crucible, a strip of metal (e.g., sodium) may be placed within the crucible and heated. The molten metal can then be mechanically agitated so that the crucible is wetted at all locations. In some examples, the heat generated for this initial wetting may be from the clamshell heater. In other examples, a separate localized heater may be used for the initial wetting, and then the crucible is placed into the vaporizer.

Notwithstanding the appended claims, and in addition to the examples described above, further examples are disclosed in the following numbered clauses:

1. A vaporizer comprising:
    an outer tube configured to receive a flow of heated gas;
    an inner tube disposed at least partially within the outer tube, wherein the inner tube is spaced apart from the outer tube such that the flow of heated gas is channeled through an annular space therebetween;

a crucible disposed at least partially within the inner tube, wherein the crucible is extendable and retractable relative to the inner tube and within the outer tube, and wherein the crucible is configured to hold a molten metal such that a surface area of the molten metal exposed to the flow of heated gas is adjustable based on the position of the crucible relative to the inner tube; and a heater configured to vaporize the molten material, wherein the vapor mixes with the flow of heated gas.

2. The vaporizer of clause 1, wherein when the crucible is retracted within the inner tube, the molten metal is not directly exposed to the flow of heated gas.

3. The vaporizer as in any preceding clause, wherein the heater comprises a clamshell heater at least partially enclosing the outer tube.

4. The vaporizer as in any preceding clause, further comprising a sintered metal filter downstream of the outer tube that is configured to remove entrained droplets or aerosols in the mixture of vapor and heated gas.

5. The vaporizer as in any preceding clause, further comprising a movement mechanism configured to control the position of the crucible relative to the inner tube.

6. The vaporizer of clause 5, wherein the movement mechanism includes a thermocouple configured to measure the temperature of the molten metal.

7. The vaporizer as in any preceding clause, further comprising a thermocouple disposed upstream of the outer tube and configured to measure the temperature of the flow of heated gas.

8. A vaporizer comprising:
an outer chamber having an inlet and an outlet, wherein a longitudinal axis is defined between the inlet and the outlet;
an inner chamber disposed at least partially within the outer chamber, wherein the inner chamber has an end disposed proximate the inlet of the outer chamber;
an elongate boat disposed at least partially within the inner chamber, wherein the elongate boat has a distal end that is configured to extend and retract relative to the end of the inner chamber and along the longitudinal axis; and
a heater at least partially surrounding the elongate boat.

9. The vaporizer of clause 8, wherein the outer chamber includes an outer tube and the inner chamber includes an inner tube, and wherein the inner tube is concentric with the outer tube.

10. The vaporizer as in any of clauses 8 or 9, further comprising a filter coupled to the outlet of the outer chamber, and wherein the filter is disposed at least partially within the heater.

11. The vaporizer as in any of clauses 8-10, further comprising a movement mechanism coupled to a proximal end of the elongate boat.

12. The vaporizer of clause 11, wherein the movement mechanism extends at least partially through a second end of the inner chamber.

13. The vaporizer as in any of clauses 8-12, wherein the end of the inner channel is at least partially enclosed.

14. The vaporizer as in any of clauses 8-13, further comprising a gas manifold coupled to the inlet of the outer chamber.

15. A method for vaporizing molten metal comprising:
heating a charge of molten metal held within a crucible to generate a vapor output, wherein the crucible is disposed at least partially within an inner chamber;
flowing heated inert gas into an inlet of an outer chamber, wherein the inner chamber is at least partially disposed within the outer chamber;

channeling the flow of heated inert gas between the inner chamber and the outer chamber;
passing the flow of heated inert gas over a surface area of the molten metal, wherein upon the heated inert gas passing over the surface area, at least a portion of the vapor output mixes therewith; and
selectively moving the crucible relative to the inner chamber so as to adjust the surface area of the molten metal exposed to the flow of heated inert gas and change the vapor output of the molten material.

16. The method of clause 15, further comprising filtering the mixture of vapor output and heated inert gas to remove entrained droplets or aerosols.

17. The method as in any of clauses 15 and 16, wherein heating the charge of molten metal within the crucible comprises dissolving oxides within the molten metal.

18. The method as in any of clauses 15-17, wherein the molten metal and the inert gas are heated to approximately an equal temperature.

19. The method as in any of clauses 15-18, wherein the molten metal includes sodium.

20. The method as in any of clauses 15-19, further comprising calibrating a sodium ionization detector via the vapor output.

It is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. It must be noted that, as used in this specification, the singular forms "a," "an," and "the" include plural referents unless the context clearly dictates otherwise.

It will be clear that the systems and methods described herein are well adapted to attain the ends and advantages mentioned as well as those inherent therein. Those skilled in the art will recognize that the methods and systems within this specification may be implemented in many manners and as such is not to be limited by the foregoing exemplified examples and examples. In this regard, any number of the features of the different examples described herein may be combined into one single example and alternate examples having fewer than or more than all of the features herein described are possible.

While various examples have been described for purposes of this disclosure, various changes and modifications may be made which are well within the scope contemplated by the present disclosure. Numerous other changes may be made which will readily suggest themselves to those skilled in the art and which are encompassed in the spirit of the disclosure.

What is claimed is:

1. A vaporizer comprising:
an outer tube configured to receive a flow of heated gas, the outer tube defining a longitudinal axis;
an inner tube disposed at least partially within the outer tube extending along the longitudinal axis, wherein the inner tube is spaced apart from the outer tube such that the flow of heated gas is channeled through an annular space therebetween;
a crucible disposed at least partially within the inner tube, wherein the crucible is moveable relative to a distal end of the inner tube and within the outer tube along the longitudinal axis between at least an extended position and a fully retracted position, wherein the crucible is configured to hold a molten metal such that a surface area of the molten metal exposed to the flow of heated gas is adjustable based on the position of the crucible relative to the inner tube, wherein when the crucible is in the fully retracted position relative to the distal end of the inner tube, the crucible is in fluid communication with the outer tube through the distal end of the inner tube, and wherein the crucible and the inner tube are at a same rotational orientation relative to the longitudinal axis in the extended position and the fully retracted position; and a heater configured to vaporize the molten metal, wherein the vapor mixes with the flow of heated gas.

2. The vaporizer of claim 1, wherein when the crucible is retracted within the inner tube, the molten metal is not directly exposed to the flow of heated gas.

3. The vaporizer of claim 1, wherein the heater comprises a clamshell heater at least partially enclosing the outer tube.

4. The vaporizer of claim 1, further comprising a sintered metal filter downstream of the outer tube that is configured to remove entrained droplets or aerosols in the mixture of vapor and heated gas.

5. The vaporizer of claim 1, further comprising a movement mechanism configured to control the position of the crucible relative to the inner tube.

6. The vaporizer of claim 5, wherein the movement mechanism includes a thermocouple configured to measure the temperature of the molten metal.

7. The vaporizer of claim 1, further comprising a thermocouple disposed upstream of the outer tube and configured to measure the temperature of the flow of heated gas.

8. The vaporizer of claim 1, further comprising a thermocouple configured to measure the temperature of the molten metal, wherein at least a portion of the thermocouple is disposed within the crucible.

9. A vaporizer comprising:

an outer chamber having an inlet and an outlet, wherein a longitudinal axis is defined between the inlet and the outlet;

an inner chamber disposed at least partially within the outer chamber, wherein the inner chamber has an end disposed proximate the inlet of the outer chamber;

an elongate boat disposed at least partially within the inner chamber, wherein the elongate boat has a distal end that is configured to move between at least an extended position and a fully retracted position relative to the end of the inner chamber and along the longitudinal axis, wherein when the elongate boat is in the fully retracted position relative to the end of the inner chamber, the elongate boat is not sealed relative to the outer chamber, and wherein the elongate boat and the inner chamber are prevented from rotating about the longitudinal axis relative to one another in the extended position and the fully retracted position; and a heater at least partially surrounding the elongate boat.

10. The vaporizer of claim 9, wherein the outer chamber includes an outer tube and the inner chamber includes an inner tube, and wherein the inner tube is concentric with the outer tube.

11. The vaporizer of claim 9, further comprising a filter coupled to the outlet of the outer chamber, and wherein the filter is disposed at least partially within the heater.

12. The vaporizer of claim 9, further comprising a movement mechanism coupled to a proximal end of the elongate boat.

13. The vaporizer of claim 12, wherein the movement mechanism extends at least partially through a second end of the inner chamber.

14. The vaporizer of claim 9, wherein the end of the inner chamber is at least partially enclosed.

15. The vaporizer of claim 9, further comprising a gas manifold coupled to the inlet of the outer chamber.

16. The vaporizer of claim 9, further comprising a thermocouple, wherein at least a portion of the thermocouple is disposed within the elongate boat.

* * * * *